(12) United States Patent
Liu

(10) Patent No.: US 8,154,906 B2
(45) Date of Patent: Apr. 10, 2012

(54) MEMORY CELLS, MEMORY CELL PROGRAMMING METHODS, MEMORY CELL READING METHODS, MEMORY CELL OPERATING METHODS, AND MEMORY DEVICES

(75) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 86 days.

(21) Appl. No.: 12/833,810

(22) Filed: Jul. 9, 2010

(65) Prior Publication Data

US 2010/0271863 A1 Oct. 28, 2010

Related U.S. Application Data

(63) Continuation of application No. 12/014,232, filed on Jan. 15, 2008, now Pat. No. 7,768,812.

(51) Int. Cl.
*G11C 11/00* (2006.01)
(52) U.S. Cl. .... 365/148; 365/115; 365/100; 365/210.12
(58) Field of Classification Search .................. 365/148, 365/115, 100, 210.12
See application file for complete search history.

(56) References Cited

U.S. PATENT DOCUMENTS

| | | | |
|---|---|---|---|
| 4,715,685 A | 12/1987 | Yaniv et al. |
| 4,964,080 A | 10/1990 | Tzeng |
| 5,049,970 A | 9/1991 | Tanaka et al. |
| 5,122,476 A | 6/1992 | Fazan et al. |
| 6,524,867 B2 | 2/2003 | Yang et al. |
| 6,552,952 B2 | 4/2003 | Pascucci |
| 6,693,821 B2 | 2/2004 | Hsu et al. |
| 6,693,846 B2 | 2/2004 | Fibranz |
| 6,753,561 B1 | 6/2004 | Chevallier et al. |
| 6,753,562 B1 | 6/2004 | Hsu et al. |
| 6,778,421 B2 * | 8/2004 | Tran .............................. 365/105 |
| 6,785,159 B2 | 8/2004 | Tuttle |
| 6,806,531 B1 | 10/2004 | Chen et al. |
| 6,834,008 B2 | 12/2004 | Rinerson et al. |
| 6,905,937 B2 | 6/2005 | Hsu et al. |
| 6,930,324 B2 | 8/2005 | Kowalski et al. |

(Continued)

FOREIGN PATENT DOCUMENTS

CN 101005113 12/2006

(Continued)

OTHER PUBLICATIONS

PCT/US2008/084422, Mar. 19, 2009, Search Report.

(Continued)

*Primary Examiner* — Thong Q Le
(74) *Attorney, Agent, or Firm* — Wells St. John, P.S.

(57) ABSTRACT

Embodiments disclosed include memory cell operating methods, memory cell programming methods, memory cell reading methods, memory cells, and memory devices. In one embodiment, a memory cell includes a wordline, a first bitline, a second bitline, and a memory element. The memory element is electrically connected to the wordline and selectively electrically connected to the first bitline and the second bitline. The memory element stores information via a resistive state of the memory element. The memory cell is configured to convey the resistive state of the memory element via either a first current flowing from the first bitline through the memory element to the wordline or a second current flowing from the wordline through the memory element to the second bitline.

29 Claims, 4 Drawing Sheets

U.S. PATENT DOCUMENTS

| | | |
|---|---|---|
| 6,940,113 B2 | 9/2005 | Hsu et al. |
| 6,946,702 B2 | 9/2005 | Jang |
| 6,955,992 B2 | 10/2005 | Zhang et al. |
| 6,958,273 B2 | 10/2005 | Chen et al. |
| 6,961,258 B2 | 11/2005 | Lowrey |
| 6,970,375 B2 | 11/2005 | Rinerson et al. |
| 6,972,211 B2 | 12/2005 | Hsu et al. |
| 7,002,197 B2 | 2/2006 | Perner et al. |
| 7,005,350 B2 | 2/2006 | Walker et al. |
| 7,009,278 B2 | 3/2006 | Hsu |
| 7,029,924 B2 | 4/2006 | Hsu et al. |
| 7,029,925 B2 | 4/2006 | Celii et al. |
| 7,050,316 B1 | 5/2006 | Lin et al. |
| 7,067,862 B2 | 6/2006 | Rinerson et al. |
| 7,085,167 B2 | 8/2006 | Lee et al. |
| 7,149,108 B2 | 12/2006 | Rinerson et al. |
| 7,167,387 B2 | 1/2007 | Sugita et al. |
| 7,180,160 B2 | 2/2007 | Ferrant et al. |
| 7,187,201 B1 | 3/2007 | Trimberger |
| 7,193,267 B2 | 3/2007 | Hsu et al. |
| 7,205,238 B2 | 4/2007 | Pan et al. |
| 7,233,024 B2 | 6/2007 | Scheuerlein et al. |
| 7,236,389 B2 | 6/2007 | Hsu |
| 7,247,876 B2 | 7/2007 | Lowrey |
| 7,273,791 B2 | 9/2007 | Basceri et al. |
| 7,323,349 B2 | 1/2008 | Hsu et al. |
| 7,388,775 B2 | 6/2008 | Bedeschi et al. |
| 7,393,785 B2 | 7/2008 | Uhlenbrock et al. |
| 7,405,967 B2 | 7/2008 | Kozicki et al. |
| 7,544,987 B2 | 6/2009 | Lu et al. |
| 7,557,424 B2 | 7/2009 | Wong et al. |
| 7,560,815 B1 | 7/2009 | Vaartstra et al. |
| 7,570,511 B2 | 8/2009 | Cho et al. |
| 7,639,523 B2 | 12/2009 | Celinska et al. |
| 7,679,812 B2 | 3/2010 | Sasagawa et al. |
| 7,687,793 B2 | 3/2010 | Harshfield et al. |
| 7,696,077 B2 | 4/2010 | Liu |
| 7,727,908 B2 | 6/2010 | Ahn et al. |
| 7,751,163 B2 | 7/2010 | Duch et al. |
| 7,755,076 B2 | 7/2010 | Lung |
| 7,768,812 B2 | 8/2010 | Liu |
| 7,772,580 B2 | 8/2010 | Hofmann et al. |
| 7,777,215 B2 | 8/2010 | Chien et al. |
| 2002/0018355 A1 | 2/2002 | Johnson et al. |
| 2002/0196695 A1 | 12/2002 | Pascucci |
| 2003/0218929 A1 | 11/2003 | Fibranz |
| 2003/0223283 A1 | 12/2003 | Kunikiyo |
| 2004/0002186 A1 | 1/2004 | Vyvoda et al. |
| 2004/0100835 A1 | 5/2004 | Sugibayashi et al. |
| 2004/0108528 A1 | 6/2004 | Hsu et al. |
| 2004/0124407 A1 | 7/2004 | Kozicki et al. |
| 2004/0245547 A1 | 12/2004 | Stipe |
| 2005/0032100 A1 | 2/2005 | Heath et al. |
| 2005/0054119 A1 | 3/2005 | Hsu et al. |
| 2005/0161747 A1 | 7/2005 | Lung et al. |
| 2005/0217408 A1 | 8/2005 | Lung et al. |
| 2005/0205943 A1 | 9/2005 | Yamada et al. |
| 2005/0250281 A1 | 11/2005 | Ufert et al. |
| 2005/0269646 A1 | 12/2005 | Yamada |
| 2005/0287741 A1 | 12/2005 | Ding |
| 2006/0035451 A1 | 2/2006 | Hsu |
| 2006/0062049 A1 | 3/2006 | Lee et al. |
| 2006/0099813 A1 | 5/2006 | Pan et al. |
| 2006/0160304 A1 | 7/2006 | Hsu et al. |
| 2006/0170027 A1 | 8/2006 | Lee et al. |
| 2006/0171200 A1 | 8/2006 | Rinerson et al. |
| 2006/0258079 A1 | 11/2006 | Lung et al. |
| 2006/0284242 A1 | 12/2006 | Jo |
| 2007/0010082 A1 | 1/2007 | Pinnow et al. |
| 2007/0015330 A1 | 1/2007 | Li et al. |
| 2007/0045615 A1 | 3/2007 | Cho et al. |
| 2007/0048990 A1 | 3/2007 | Zhuang et al. |
| 2007/0109835 A1 | 5/2007 | Hsu |
| 2007/0121369 A1 | 5/2007 | Happ |
| 2007/0132049 A1 | 6/2007 | Stipe et al. |
| 2007/0165434 A1 | 7/2007 | Lee et al. |
| 2007/0167008 A1 | 7/2007 | Hsu et al. |
| 2007/0173019 A1 | 7/2007 | Ho et al. |
| 2007/0224770 A1 | 9/2007 | Nagashima |
| 2007/0231988 A1 | 10/2007 | Yoo et al. |
| 2007/0246795 A1 | 10/2007 | Fang et al. |
| 2007/0257257 A1 | 11/2007 | Cho et al. |
| 2007/0258279 A1 | 11/2007 | Lung et al. |
| 2007/0268739 A1 | 11/2007 | Yoo et al. |
| 2007/0268742 A1 | 11/2007 | Liu |
| 2007/0285965 A1 | 12/2007 | Toda et al. |
| 2007/0295950 A1 | 12/2007 | Cho et al. |
| 2008/0012064 A1 | 1/2008 | Park et al. |
| 2008/0014750 A1 | 1/2008 | Nagashima |
| 2008/0026547 A1 | 1/2008 | Yin et al. |
| 2008/0029754 A1 | 2/2008 | Min et al. |
| 2008/0029842 A1 | 2/2008 | Symanczyk |
| 2008/0048165 A1 | 2/2008 | Miyazawa |
| 2008/0049487 A1 | 2/2008 | Yoshimura et al. |
| 2008/0073635 A1 | 3/2008 | Kiyotoshi et al. |
| 2008/0080229 A1 | 4/2008 | Choi et al. |
| 2008/0102278 A1 | 5/2008 | Kreupl et al. |
| 2008/0157257 A1 | 7/2008 | Bertin et al. |
| 2008/0175031 A1 | 7/2008 | Park et al. |
| 2008/0185571 A1 | 8/2008 | Happ et al. |
| 2008/0232160 A1 | 9/2008 | Gopalakrishnan |
| 2008/0247219 A1 | 10/2008 | Choi et al. |
| 2008/0258126 A1 | 10/2008 | Lung |
| 2008/0303014 A1 | 12/2008 | Goux et al. |
| 2009/0014706 A1 | 1/2009 | Lung |
| 2009/0014707 A1 | 1/2009 | Lu et al. |
| 2009/0085121 A1 | 4/2009 | Park et al. |
| 2009/0180309 A1 | 7/2009 | Liu |
| 2009/0250681 A1 | 10/2009 | Smythe et al. |
| 2009/0267047 A1 | 10/2009 | Sasago et al. |
| 2009/0268532 A1 | 10/2009 | DeAmbroggi et al. |
| 2009/0272960 A1 | 11/2009 | Srinivasan et al. |
| 2009/0303780 A1 | 12/2009 | Kasko et al. |
| 2009/0315090 A1 | 12/2009 | Weis et al. |
| 2009/0316467 A1 | 12/2009 | Liu |
| 2009/0317540 A1 | 12/2009 | Sandhu et al. |
| 2010/0003782 A1 | 1/2010 | Sinha et al. |
| 2010/0008163 A1 | 1/2010 | Liu |
| 2010/0065836 A1 | 3/2010 | Lee et al. |
| 2010/0110759 A1 | 5/2010 | Jin et al. |
| 2010/0135061 A1 | 6/2010 | Li et al. |
| 2010/0163820 A1 | 7/2010 | Son |
| 2010/0163829 A1 | 7/2010 | Wang et al. |
| 2010/0193758 A1 | 8/2010 | Tian et al. |
| 2010/0193761 A1 | 8/2010 | Amin et al. |
| 2010/0193762 A1 | 8/2010 | Hsieh et al. |
| 2010/0232200 A1 | 9/2010 | Shepard |
| 2010/0237442 A1 | 9/2010 | Li et al. |

FOREIGN PATENT DOCUMENTS

| | | |
|---|---|---|
| CN | 101051670 | 4/2007 |
| CN | 101034732 | 9/2007 |
| EP | 1796103 | 9/2006 |
| JP | 2005175457 | 6/2005 |
| JP | 2006040981 | 2/2006 |
| JP | 2006121044 | 5/2006 |
| KR | 1020060087882 | 8/2006 |
| KR | 20070111840 | 11/2007 |
| KR | 20070118865 | 12/2007 |
| WO | WO2006/003620 | 1/2006 |
| WO | WO 2009/127187 A2 | 10/2009 |
| WO | WO2010/068221 | 6/2010 |
| WO | WO2010/082923 | 7/2010 |
| WO | WO2010/082928 | 7/2010 |
| WO | WO2010/085241 | 7/2010 |
| WO | WO2010/087854 | 8/2010 |

OTHER PUBLICATIONS

PCT/US2008/084422, Mar. 19, 2009, Written Opinion.

Chen, A., et al., "Non-Volatile Resistive Switching for Advanced Memory Applications" IEEE, 2005.

Dongsoo, L., et al., "Resistance Switching of Al doped ZnO for Non Volatile Memory Applications".

Hosoi, Y., et al., "High Speed Unipolar Switching Resistance RAM (RRAM) Technology".

Hudgens, S. et al., "Overview of Phase-Change Chalcogenide Nonvolatile Memory Technology" MRS Bulletin, Nov. 2004, pp. 829-832.

Ignatiev, A., et al., "Resistance Non-volatile Memory-RRAM" Mater. Res. Soc. Symp. Proc. vol. 997 2007 Materials Research Society.

Kozicki, M., "Memory Devices Based on Solid Electrolytes" Mater. Res. Soc. Symp. Proc. vol. 997, 2007 Materials Research Society.

Oh, J.H., "Full Integration of Highly Manufacturable 512Mb PRAM based on 90nm Technology" 2006 IEEE.

Wuttig, Matthias, "Towards a Universal Memory?" Nature Materials, vol. 4, Apr. 2005.

PCT/US2008/084422, Jul. 20, 2010, IPRP.

U.S. Appl. No. 12/701,885, filed Feb. 8, 2010, Sandhu et al.

U.S. Appl. No. 12/765,598, filed Apr. 22, 2010, Sandhu et al.

U.S. Appl. No. 12/765,606, filed Apr. 22, 2010, Tang et al.

U.S. Appl. No. 12/959,015, filed Dec. 2, 2010, Liu.

Baek et al., "Multi-Layer Cross-point Binary Oxide Resistive Memory (OxRRAM) for Post-NAND Storage application", IEEE, 2005.

Bedeschi et al., "A Bipolar-Selected Phase Change Memory Featuring Multi-Level Cell Storage", IEEE, vol. 44, No. 1, Jan. 2009, pp. 217-227.

Chen et al., "Peroskite RRAM Devices with Metal/Insulator/PCMO/Metal Heterostructures", 2005; pp. 125-128.

Choi et al., "Defect Structure and Electrical Properties of Single-Crystal Ba0.03SR0.97TiO3", J. Am. Ceram. Soc., 71, [4], pp. 201-205, 1988.

Courtade et al., "Microstructure and resistance switching in NiO binary oxide films obtained from Ni oxidation", IEEE, 2006, pp. 94-99.

Ho et al., A Highly Reliable Self-Aligned Graded Oxide WOx Resistance Memory: Conduction Mechanisms and Reliability; 2007 Symp. on VLSI Tech. Digest of Technical Papers; 228-9.

http://en.wikipedia.org/wiki/Programmable_metallization_cell; Sep. 2010; 4 pp.

Karg et al., "Nanoscale Resistive Memory Device using SrRiO3 Films", IEEE, 2007, pp. 68-70.

Kau et al., "A Stackable cross point phase change memory", IEEE, 2009, pp. 27.1.1-27.1.4.

Komori et al., Disturbless flash memory due to high boost efficiency on BiCS structure and optimal memory film stack for ultra high density storage device; Dec. 2008; pp. 851-854.

Kozicki, "Memory Devices Based on Solid Electrolytes" Mater. Res. Soc. Symp. Proc. vol. 997, 2007, Materials Research Society, 10 pages.

Lee et al., "2-stack 1D-1R Cross-point Structure with Oxide Diodes as Switch Elements for High Density Resistance RAM Appilcations", IEEE, 2007, pp. 771-774.

Lin et al., "Effect of Top Electrode Material on Resistive Switching Properties of ZrO2 Film Memory Devices", IEEE, May 2007, vol. 28, No. 5, pp. 366-368.

Meyer et al., "Oxide Dual-Layer Memory Element for Scalable Non-Volatile Cross-Point Memory Technology", IEEE, 2008, 5 pages.

Miyashita et al., "A Novel Bit-Line Process using Poly-Si Masked Dual-Damascene (PMDD) for 0.13 um DRAMs and Beyond", IEEE, 2000, pp. 15.4.1-15.4.4.

Muller et al., "Emerging Non-Volatile Memory Technologies", IEEE, 2003, pp. 37-44.

Pein et al., "Performance of the 3-D Pencil Flash EPROM Cell and Memory Array", IEEE, 1995, pp. 1982-1991.

Pellizzer et al.; A 90nm Phase Change Memory Technology for Stand-Alone Non-Volatile Memory Applications; IEEE, 2006, Symp. on VLSI Tech. Digest of Technical Papers; 2 pp. Abst.

Pirovano et al., "Self-Aligned u Trench Phase-Change Memory Cell Architecture for 90nm Technology and Beyond", IEEE, 2007, pp. 222-225. Abstract Only.

Yoon et al.; Vertical Cross-point Resistance Change Memory for Ultra-High Density Non-volatile Memory Applications; 2009 Symp. on VLSI Tech. Digest of Technical Papers; pp. 26-27.

Yu et al., "Structure Effects on Resistive Switching of Al/TiOx/A1 Devices for RRAM Applications", IEEE, 2008, pp. 331-333.

U.S. Appl. No. 12/979, 189 dated Dec. 27, 2010 Sills et al.

U.S. Appl. No. 13/010,048 dated Jan. 20, 2011 Liu et al.

Kooij et al.; Photoselective Metal Deposition on Amorphous Silicon p-i-n Solar Cells; Journal of Electrochemical Society vol. 44, No. 10, Oct. 1997, pp. L271-272.

Scheck et al., "Selective Metal Electrodeposition Through Doping Modulation of Semiconductor Surfaces". Applied Physics Letters 86, 2005, 3 pgs.

Xing et al., Characterization of AIGaN/GaN p-n Diodes with Selectively Regrown n-AIGaN by Metal-Organic Chemical-Vapor Deposition and its Application to GaN-Based Bipolar transistors; Journal of Applied Physics, 97; May 25, 2005; 4 pp.

Yih et al., "SiC/Si Heterojunction Diodes Fabricated by Self-Selective and by Blanket Rapid Thermal Chemical Vapor Deposition", IEEE vol. 41 No. 3, Mar. 1994, pp. 281-287.

Higaki et al.; Effects of GasPhase Absorption into Si Substrates on Plasma Doping Process; Tokyo Institute of Technology; ESSDERC 2003; 4 pp.

\* cited by examiner

MEMORY CELLS, MEMORY CELL PROGRAMMING METHODS, MEMORY CELL READING METHODS, MEMORY CELL OPERATING METHODS, AND MEMORY DEVICES

CROSS REFERENCE TO RELATED APPLICATION

This application is a continuation of U.S. patent application Ser. No. 12/014,232 which was filed on Jan. 15, 2008 now, U.S. Pat. No. 7,768,812 and which is incorporated herein by reference.

TECHNICAL FIELD

Embodiments disclosed herein pertain to memory cells, memory cell programming methods, memory cell reading methods, memory cell operating methods, and memory devices.

BACKGROUND

Resistive random access memories may use a material capable of being configured in one of two different resistive states to store information. When configured in one of the resistive states, the material may have a high resistance to electrical current. In contrast, when configured in the other resistive state, the material may have a low resistance to electrical current. The resistive state in which the material is configured may be changed using electrical signals. For example, if the material is in a high-resistance state, the material may be configured to be in a low-resistance state by applying a voltage across the material.

The resistive state may be persistent. For example, once configured in a resistive state, the material may stay in the resistive state even if neither a current nor a voltage is applied to the material. Furthermore, the configuration of the material may be repeatedly changed from the high resistance state to the low resistance state or from the low resistance state to the high resistance state.

DETAILED DESCRIPTION OF EXAMPLE EMBODIMENTS

Embodiments of the invention encompass memory cell operating methods, memory cell programming methods, memory cell reading methods, memory cells, and memory devices. Example embodiments of such methods, memory cells, and memory devices are described with reference to FIGS. 1-6.

Random access memories may use resistive states of a memory element to store one or more bits of information. For example, a memory element capable of being configured in either a high-resistance state or a low-resistance state may store one bit of information by associating a bit value of "1" with the low-resistance state and a bit value of "0" with the high-resistance state. Alternatively, a bit value of "1" may be associated with the high-resistance state and a bit value of "0" may be associated with the low-resistance state.

The memory element may include a bipolar memory material. A positive voltage applied across the bipolar memory material may change the configuration of the bipolar memory material from a high-resistance state to a low-resistance state. Furthermore, a negative voltage applied across the bipolar memory material may change the configuration of the bipolar memory material from a low-resistance state to a high-resistance state.

Alternatively, a negative voltage applied across the bipolar memory material may change the configuration of the bipolar memory material from a high-resistance state to a low-resistance state and a positive voltage applied across the bipolar memory material may change the configuration of the bipolar memory material from a low-resistance state to a high-resistance. Accordingly, a bipolar memory material may be configured in a first resistive state using a voltage having a first polarity and may be configured in a second resistive state using a voltage having a polarity opposite that of the first polarity.

Examples of bipolar memory material include ionic conducting chalcogenides, binary metal oxides, perovskite oxides, colossal magnetoresistives, and polymers. Example ionic conducting chalcogenides that may be used as bipolar memory material include GeS, GeSe and Ag or Cu-doped GeS and GeSe. Example binary metal oxides that may be used as bipolar memory material include $HfO_x$, $Nb_2O_5$, $Al_2O_3$, WOx, $Ta_2O_5$, $TiO_x$, $ZrO_x$, $Cu_xO$, and $Ni_xO$. Example ionic perovskite oxides that may be used as bipolar memory material include doped or undoped $SrTiO_3$, $SrZrO_3$, $BaTiO_3$.

Example colossal magnetoresistives that may be used as bipolar memory material include $Pr_{1-x}Ca_xMnO_3$ (PCMO), $La_{1-x}Ca_xMnO_3$ (LCMO), and $Ba_{1-x}Sr_xTiO_3$. Example polymers that may be used as bipolar memory material include Bengala Rose, $AlQ_3Ag$, Cu-TCNQ, DDQ, TAPA, and fluorescine-based polymers. Of course, other materials may be used as bipolar memory material. The materials listed above are provided by way of example rather than as an exhaustive list of bipolar memory material.

Figure 1:
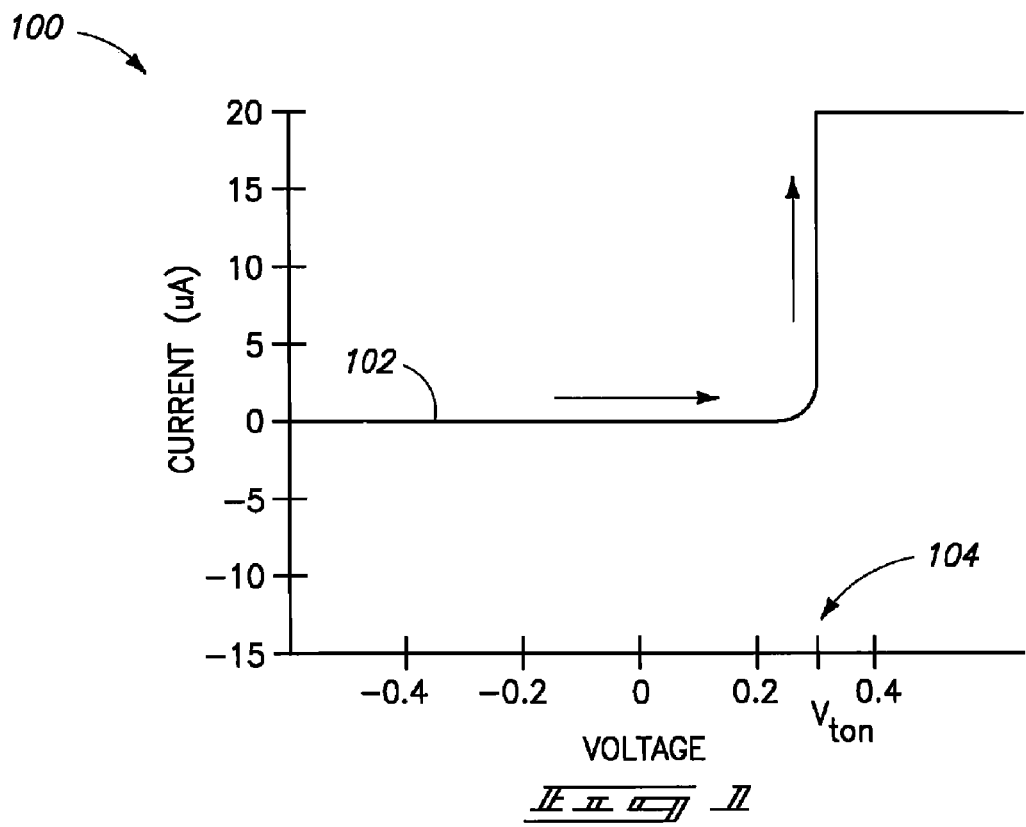
FIG. 1 is a chart illustrating voltage/current relationships.

Referring to FIG. 1, a chart 100 depicts one example of a relationship 102 between voltages applied to a memory element initially in a high-resistance state and currents through the memory element resulting from the voltages. The memory element may comprise one or more of the bipolar memory materials described above. Chart 100 illustrates that as voltages applied to the memory element increase from −0.6 V to 0.2 V, no current, or a negligible amount of current, for example less than 1 micro amp, flows through the memory element. However, at a voltage substantially equal to a turn-on voltage 104, the memory element begins conducting current. As the voltage across the memory element is increased beyond turn-on voltage 104, the amount of current conducted by the memory element increases with the voltage without current clamping. The flattening of the current with voltage depicted in FIG. 1 results from current clamping of a measurement circuit.

Thus, chart 100 illustrates a change in the resistive state of the memory element. Initially, the memory element is in a high-resistance state as evidenced by the fact that the memory element does not conduct current or conducts a negligible amount of current when voltages smaller than the turn-on voltage are applied to the memory element. In this high-resistance state, the memory element may have a resistance of about or above $10^9$ ohms. However, once a voltage greater than or equal to turn-on voltage 104 is applied to the memory element, the memory element configures itself in a low-resistance state as evidenced by the fact that the memory element begins conducting current. In this low-resistance state, the memory element may be highly conductive and have a resistance of about a few thousand ohms.

Figure 2:
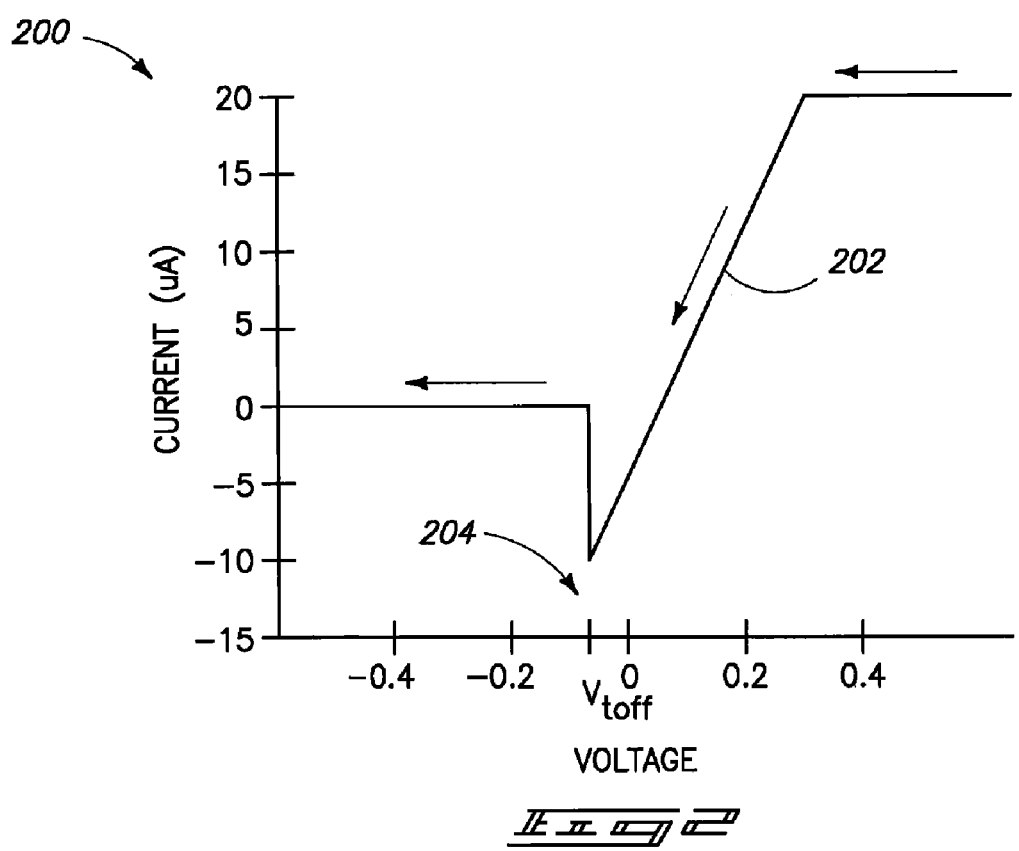
FIG. 2 is chart illustrating other voltage/current relationships.

Referring to FIG. 2, a chart 200 depicts one example of a relationship 202 between voltages applied to a memory element initially in the low-resistance state described above and currents running through the memory element resulting from the voltages. Chart 200 illustrates that currents resulting from voltages greater than about 0.25 V are substantially the same, which results from current clamping of a measurement circuit. Without the current clamping, the current increases with voltage. As the voltage is decreased below about 0.25 V, the current through the memory element accordingly decreases. As the voltage applied across the memory element becomes negative, the current through the memory element is also negative. However, when the voltage applied across the memory element is substantially equal to a turn-off voltage 204, the amount of current through the memory element is substantially zero. As the voltage is further decreased below the turn-off voltage, the current through the memory element remains substantially zero.

Thus, chart 200 illustrates a change in resistive state of the memory element. Initially, the memory element is in the low-resistance state as evidenced by the fact that the memory element conducts current when voltages greater than turn-off voltage 204 are applied to the memory element. However, once a voltage less than or equal to turn-off voltage 204 is applied to the memory element, the memory element configures itself in the high-resistance state described above as evidenced by the fact that the memory element stops conducting current or conducts only a negligible amount of current.

In some cases, once configured in the high-resistance state, the memory element may remain in the high-resistance state as long as a voltage greater than or equal to turn-on voltage 104 is not applied to the memory element. The memory element may remain in the high-resistance state even if no voltage is applied to the memory element. Accordingly, the high-resistance state of the memory element may be described as non-volatile since the high-resistance state might not change over time as long as a voltage greater than or equal to turn-on voltage 104 is not applied to the memory element.

Similarly, in some cases, once configured in the low-resistance state, the memory element may remain in the low-resistance state as long as a voltage less than or equal to turn-off voltage 204 is not applied to the memory element. In fact, the memory element may remain in the low-resistance state even if no voltage is applied to the memory element. Accordingly, the low-resistance state of the memory element may also be described as non-volatile since the low-resistance state might not change over time as long as a voltage less than or equal to turn-off voltage 204 is not applied to the memory element.

Since the high-resistance state and the low-resistance state may be non-volatile, the memory element may be used to store one bit information. For example, a memory element may represent a bit value of "0" when configured in the high-resistance state and may represent a bit value of "1" when configured in the low-resistance state. Furthermore, the resistive state of the memory element may be repeatedly changed over time. Accordingly, the memory element may be in the high-resistance state representing a bit value of "0" at one moment in time and the memory element may be in a low-resistance state representing a bit value of "1" at another moment in time. Similarly, the representation of bit value with resistance states can be the opposite of that described above.

Figure 3:
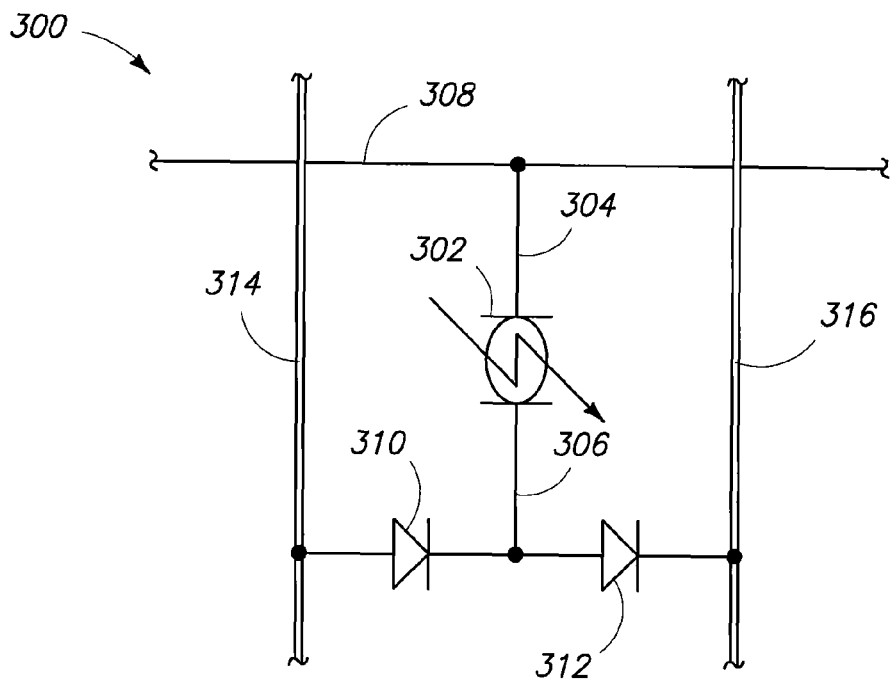
FIG. 3 is a schematic diagram of a memory cell.

Referring to FIG. 3, a memory cell 300 is illustrated. Memory cell 300 includes a memory element 302 having electrodes 306 and 304. Memory element 302 may comprise a bipolar memory material such as one or more of the bipolar memory materials discussed above. Memory cell 300 also includes a wordline 308 and two bitlines 314 and 316. Electrode 304 of memory element 302 is connected to a wordline 308.

Bitline 314 may be selectively electrically connected to memory element 302. For example, a diode 310 may be connected to bitline 314 and to electrode 306. When diode 310 is forward biased (e.g., forward biased beyond a cut-in voltage of diode 310), diode 310 may conduct current from bitline 314 to memory element 302, thereby electrically connecting bitline 314 to memory element 302. In contrast, when diode 310 is not forward biased (e.g., when diode 310 is reverse biased), diode 310 may hinder current from flowing from memory element 302 to bitline 314 or from bitline 314 to memory element 302 so that memory element 302 is not electrically connected to bitline 314.

Similarly, bitline 316 may be selectively electrically connected to memory element 302. For example, a diode 312 may be connected to bitline 316 and to electrode 306. When diode 312 is forward biased (e.g., forward biased beyond a cut-in voltage of diode 312), diode 312 may conduct current from memory element 302 to bitline 316 thereby electrically connecting memory element 302 to bitline 316. In contrast, when diode 312 is not forward biased (e.g., when diode 312 is reverse biased), diode 312 may hinder current from flowing from bitline 316 to memory element 302 or from memory element 302 to bitline 316 so that memory element 302 is not electrically connected to bitline 316.

In some configurations, a memory cell may comprise one or more devices that selectively electrically connect a memory element to a first bitline and/or a second bitline instead of diodes. For example, in one configuration, memory element 300 may use a first transistor in place of diode 310 and a second transistor in place of diode 312. When turned on, the first transistor may allow current to flow between bitline 314 and memory element 302, electrically connecting bitline 314 and memory element 302. When turned off, the first transistor may hinder current from flowing between bitline 314 and memory element 302 thereby electrically disconnecting bitline 314 and memory element 302.

Similarly, the second transistor may selectively electrically connect memory element 302 to bitline 316. Devices other than diodes or transistors may alternatively be used to selectively electrically connect memory element 302 to bitlines 314 and 316.

Memory cell 300 may store a bit of information via a resistive state of memory element 302. In one configuration, the bit may have a value of "0" or a value of "1." For example, according to one convention, if memory element 302 is in a high-resistance state, the value of the bit stored by memory cell 300 may be "0" and if memory element 302 is in a low-resistance state, the value of the bit stored by memory cell 300 may be "1." Of course, a convention in which a high-resistance state represents a bit value of "1" and a low-resistance state represents a bit value of "0" may alternatively be used.

A read operation may be used to determine a value of a bit stored by memory cell 300. According to one read operation, a first positive voltage may be applied between wordline 308 and bitline 316 so that wordline 308 is at a higher potential than bitline 316 and so that diode 312 is forward biased. The first positive voltage may be greater than a cut-in voltage of diode 312 but less than a sum of the cut-in voltage of diode 312 and the turn-off voltage (which was described above in relation to FIG. 2) of memory element 302 so that the resistive state of memory element 302 is not altered. A second positive voltage may be simultaneously applied between wordline 308 and bitline 314 so that wordline 308 is at a higher potential than bitline 314 and so that diode 310 is reverse biased. The second voltage may be lower than a breakdown voltage of diode 310. In some cases, the first voltage and the second voltage may be substantially the same voltage.

If memory element 302 is configured in a low-resistance state, current may flow from wordline 308 through memory element 302 and forward-biased diode 312 to bitline 316. Based on the current, a memory device comprising memory cell 300 may determine that memory element 302 is in a low-resistance state and therefore the value stored by memory cell 300 is a "1." For example, the memory device may compare the current on bitline 316 with a reference current or the memory device may use the current on bitline 316 to create a voltage and may then compare the voltage with a reference voltage.

In contrast, if memory element 302 is configured in a high-resistance state, memory element 302 may hinder current from flowing from wordline 308 through memory element 302 and forward-biased diode 312 to bitline 316. Alternatively, memory element 302 may restrict an amount of current flowing from wordline 308 through memory element 302 and forward-biased diode 312 to bitline 316 to a negligible amount of current that may be clearly distinguished from an amount of current allowed to flow when memory element 302 is in the low-resistance state. Based on the lack of current, or the very small amount of current, the memory device comprising memory cell 300 may determine that memory element 302 is in the high-resistance state and therefore the value stored by memory cell 300 is a "0."

Another method of reading memory cell 300 may alternatively be used. According to this method, a first positive voltage may be applied between bitline 314 and wordline 308 so that bitline 314 is at a higher potential than wordline 308 and so that diode 310 is forward biased. The first positive voltage may be greater than the cut-in voltage of diode 310 but less than a sum of the cut-in voltage of diode 310 and the turn-on voltage (which was described above in relation to FIG. 1) of memory element 302 so that the resistive state of memory element 302 is not altered. A second positive voltage may simultaneously be applied between bitline 316 and wordline 308 so that bitline 316 is at a higher potential than wordline 308 and so that diode 312 is reverse biased. The second voltage may be lower than a breakdown voltage of diode 312. In some cases, the first voltage and the second voltage may be substantially the same voltage.

If memory element 302 is configured in a low-resistance state, current may flow from bitline 314 through forward-biased diode 310 and memory element 302 to wordline 308. Based on the current on wordline 308, a memory device comprising memory cell 300 may determine that memory element 302 is in a low-resistance state and therefore the value stored by memory cell 300 is a "1."

In contrast, if memory element 302 is configured in a high-resistance state, memory element 302 may hinder current from flowing from bitline 314 through forward-biased diode 310 and memory element 302 to wordline 308. Alternatively, memory element 302 may restrict an amount of current flowing from bitline 314 through forward-biased diode 310 and memory element 302 to wordline 308 to a negligible amount that may be clearly distinguished from an amount of current allowed to flow when memory element 302 is in the low-resistance state. Based on the lack of current, or the very small amount of current, the memory device comprising memory cell 300 may determine that memory element 302 is in the high-resistance state and therefore the value stored by memory cell 300 is a "0."

In addition to reading a bit value from memory cell 300, a bit value may be written to memory cell 300. To write a bit value of "1" to memory cell 300, a first positive voltage may be applied between bitline 314 and wordline 308 so that bitline 314 is at a higher potential than wordline 308 and so that diode 310 is forward biased. The first positive voltage may be greater than a sum of the cut-in voltage of diode 310 and the turn-on voltage of memory element 302. If memory element 302 is in a high-resistance state, the first voltage (or a current resulting from the first voltage) may re-configure memory element 302 to be in a low-resistance state. If memory element 302 is already in a low-resistance state, memory element 302 may remain in the low-resistance state. Consequently, due to the first voltage, memory element 302 may be configured in a low-resistance state corresponding with a bit value of "1."

A second positive voltage may be applied simultaneously with the first voltage. The second positive voltage may be applied between bitline 316 and wordline 308 so that bitline 316 is at a higher potential than wordline 308 and so that diode 312 is reverse biased. The second voltage may hinder current from flowing from bitline 314 to bitline 316. The second voltage may be lower than a breakdown voltage of diode 312.

The first voltage may result from a first voltage pulse and the second voltage may result from a second voltage pulse. In some cases, the first voltage and the second voltage may be substantially the same voltage.

Alternatively, a bit value of "0" may be written to memory cell 300. To write a bit value of "0" to memory cell 300, a first positive voltage may be applied between wordline 308 and bitline 316 so that wordline 308 is at a higher potential than bitline 316 and so that diode 312 is forward biased. The first positive voltage may be greater than a sum of the cut-in voltage of diode 312 and the turn-off voltage of memory element 302. If memory element 302 is in a low-resistance state, the first voltage (or a current resulting from the first voltage) may re-configure memory element 302 to be in a high-resistance state. If memory element 302 is already in a high-resistance state, memory element 302 may remain in the high-resistance state. Consequently, due to the first voltage, memory element 302 may be configured in a high-resistance state corresponding with a bit value of "0."

A second positive voltage may be applied simultaneously with the first voltage. The second positive voltage may be applied between wordline 308 and bitline 314 so that wordline 308 is at a higher potential than bitline 314 and so that diode 310 is reverse biased. The second voltage may hinder current from flowing from bitline 316 to bitline 314. The second voltage may be lower than a breakdown voltage of diode 310.

The first voltage may result from a first voltage pulse and the second voltage may result from a second voltage pulse. In some cases, the first voltage and the second voltage may be substantially the same voltage.

The methods of writing a "0" and writing a "1" to memory cell 300 may be repeatedly used so that memory cell 300 stores different bit values over time. In some cases, memory element 302 may be re-written using these methods millions of times without damaging memory element 302. Since memory element 302 may remain in a resistive state without a voltage or current being applied to memory element 302 as was discussed above in relation to FIG. 1, memory element 302 may be said to preserve a bit value in a non-volatile manner. Accordingly, memory cell 300 may store a bit of information without having to be frequently refreshed or memory cell 300 may be refreshed at a rate lower than a rate used to refresh a volatile memory cell.

Figure 4:
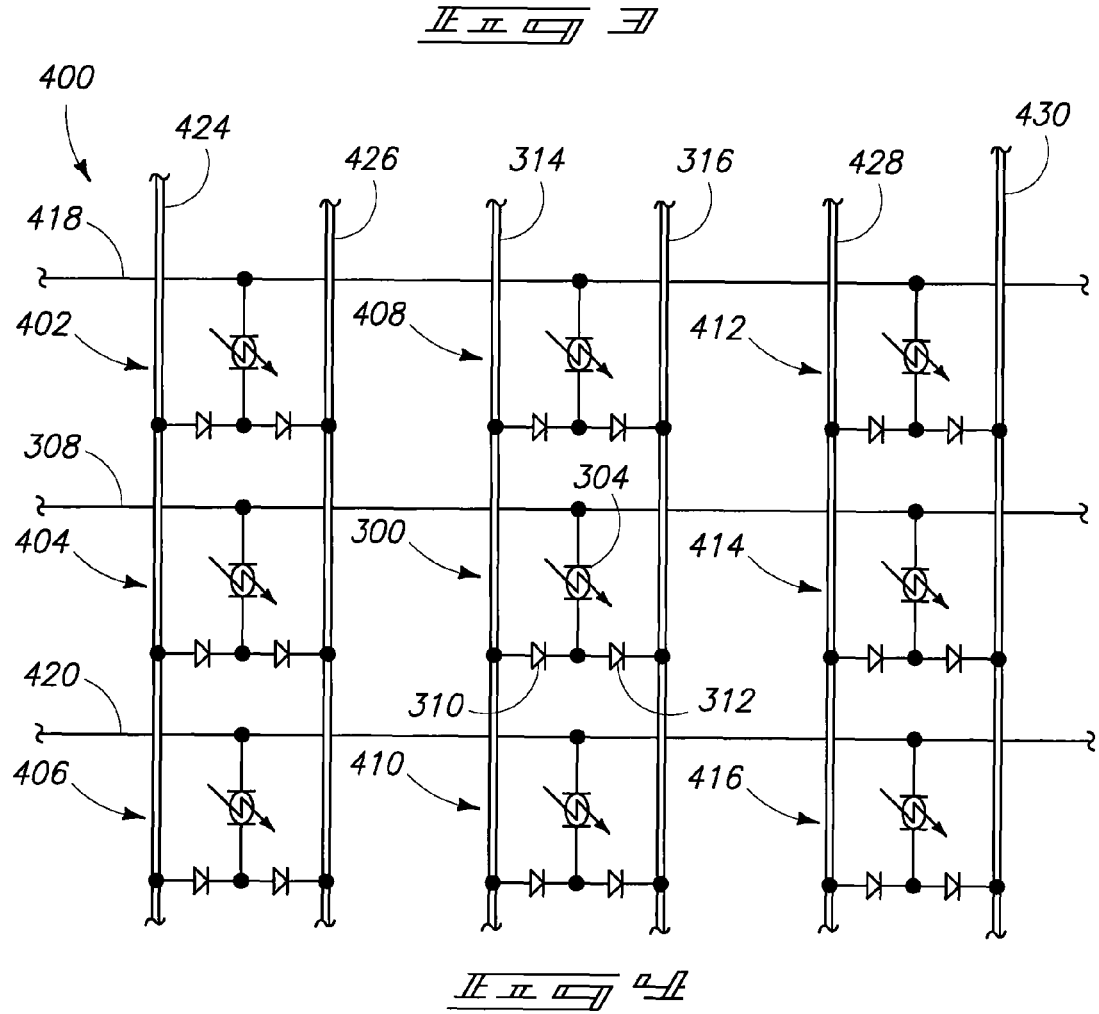
FIG. 4 is a schematic diagram of a memory device.

Referring to FIG. 4, a schematic diagram 400 of a portion of a memory device is illustrated. The memory device includes memory cell 300 as well as additional memory cells 402, 404, 406, 408, 410, 412, 414, and 416. The memory device may store a plurality of bits. For example, the memory device may store one bit in each memory cell of the memory device.

The memory cells of the memory device may be arranged to share bitlines and wordlines. In diagram 400, memory cells 402, 408, and 412 share wordline 418; memory cells 404, 300, and 414 share wordline 308; and memory cells 406, 410, and 416 share wordline 420. Furthermore, in diagram 400, memory cells 402, 404, and 406 share bitlines 424 and 426; memory cells 408, 300, and 410 share bitlines 314 and 316; and memory cells 412, 414, and 416 share bitlines 428 and 430.

Figure 5:
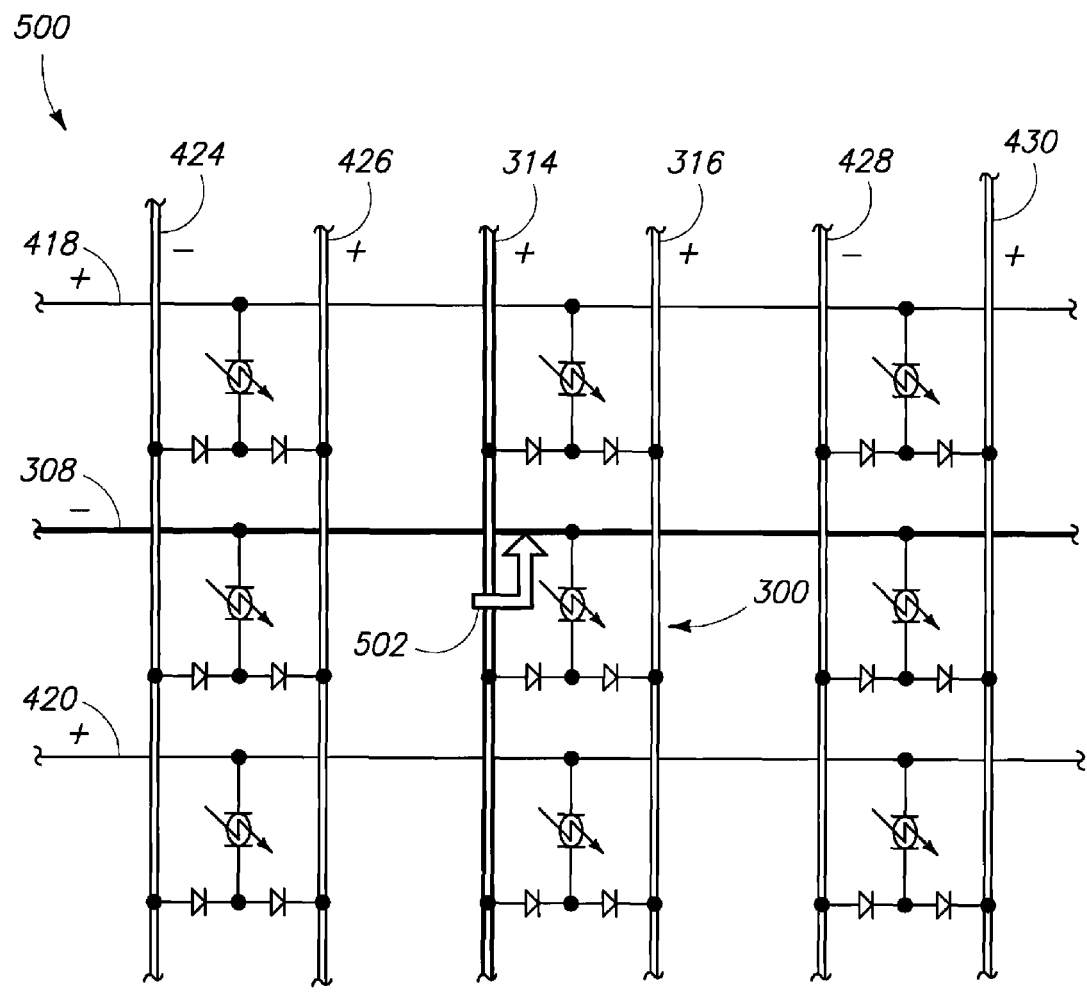
FIG. 5 is a schematic diagram of a memory device illustrating a current.

Referring to FIG. 5, a schematic diagram 500 illustrating a configuration of the memory device of FIG. 4 is illustrated. The configuration may be used to write a bit value of "1" to memory cell 300 or to read a bit of information from memory cell 300. According to the configuration, a first positive voltage is applied across bitline 314 and wordline 308. A second positive voltage is applied across bitline 316 and wordline 308. Consequently, a current may flow from bitline 314 through memory cell 300 to wordline 308 as illustrated by arrow 502 and as was described above in relation to FIG. 3. If the first voltage is greater than a sum of the cut-in voltage of diode 310 and the turn-on voltage of memory element 302, a "1" may be written to memory cell 300 as was described above in relation to FIG. 3.

Alternatively, if the first voltage is greater than the cut-in voltage of diode 310 but less than a sum of the cut-in voltage of the diode and the turn-on voltage of memory element 302, the memory device may determine the value of a bit stored by memory cell 300 based on a current flowing from bitline 314 to wordline 308 as was described above in relation to FIG. 3.

It may be desirable to ensure that values stored by memory cells 402, 404, 406, 408, 410, 412, 414, and 416 are not disturbed while writing or reading memory cell 300. To avoid disturbances, bitlines and wordlines of the memory device may be configured with particular voltages.

For example, when writing a "1" into memory cell 300, bitlines 314 and 316 may be at a higher potential than wordline 308. Since memory cells 408 and 410 are also connected to bitlines 314 and 316, wordlines 418 and 420 may be configured to be at substantially the same potential as bitlines 314 and 316 to hinder current from flowing from bitline 314 and/or bitline 316 to wordline 418 and/or wordline 420.

Furthermore, it may be desirable to hinder currents from flowing from memory cells 404 and 414 onto wordline 308 so that a current on wordline 308 may be correctly attributed to memory cell 300. To do so, bitlines 424 and 428 may be configured to be at substantially the same potential as wordline 308 to hinder current from flowing from bitline 424 to wordline 308 via memory cell 404 and to hinder current from flowing from bitline 428 to wordline 308 via memory cell 414. In addition, bitlines 426 and 430 may be configured at a higher potential than wordline 308 so that current is hindered from flowing from bitline 426 through memory cell 404 to wordline 308 and from bitline 430 through memory cell 414 to wordline 308.

Other memory cells not connected to either wordline 308 or bitlines 314 and 316 (i.e., memory cells 402, 406, 412, and 416) may be configured to hinder consumption of current. For example, bitlines 424 and 426 and wordlines 418 and 420 may be configured with voltages causing the diodes of memory cells 402 and 406 to be reverse biased. Similarly, bitlines 428 and 430 and wordlines 418 and 420 may be configured with voltages causing the diodes of memory cells 412 and 416 to be reverse biased.

Figure 6:
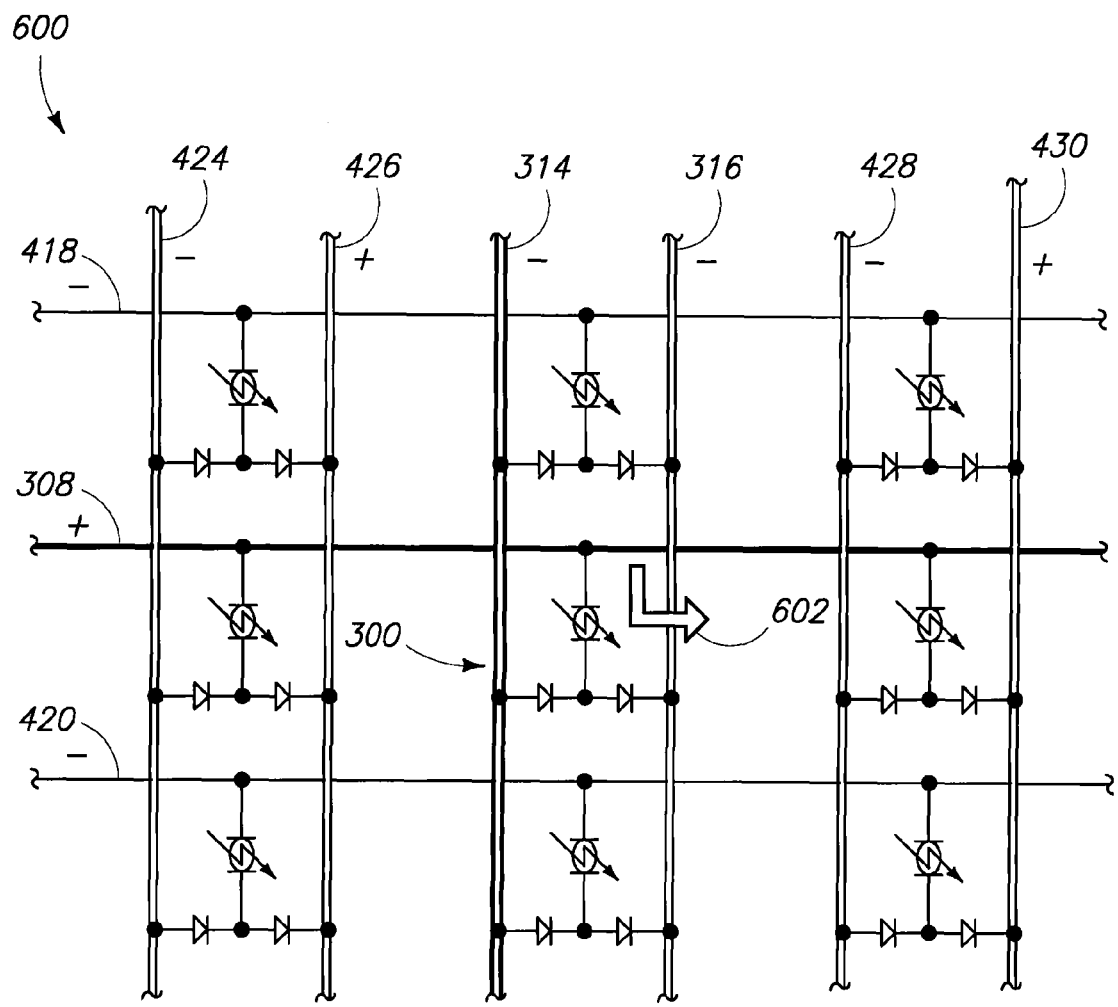
FIG. 6 is a schematic diagram of a memory device illustrating another current.

Referring to FIG. 6, a schematic diagram 600 illustrating a configuration of the memory device of FIG. 4 is illustrated. The configuration may be used to write a bit value of "0" to memory cell 300 or to read a bit of information from memory cell 300. According to the configuration, a first positive voltage is applied across wordline 308 and bitline 316. A second positive voltage is applied across wordline 308 and bitline 314. Consequently, a current may flow from wordline 308 through memory cell 300 to bitline 316 as indicated by arrow 602 and as was described above in relation to FIG. 3. If the first voltage is greater than a sum of the cut-in voltage of diode 312 and the turn-off voltage of memory element 302, a "0" may be written to memory cell 300 as was described above in relation to FIG. 3.

Alternatively, if the first voltage is greater than the cut-in voltage of diode 312 but less than a sum of the cut-in voltage of diode and the turn-off voltage of memory element 302, the memory device may determine the value of a bit stored by memory cell 300 based on a current flowing from wordline 308 to bitline 316 as was described above in relation to FIG. 3.

It may be desirable to ensure that values stored by memory cells 402, 404, 406, 408, 410, 412, 414, and 416 are not disturbed while writing or reading memory cell 300. To avoid disturbances, bitlines and wordlines of the memory device may be configured with particular voltages.

For example, when writing a "0" into memory cell 300, bitlines 314 and 316 may be at a lower potential than wordline 308. Since memory cells 408 and 410 are also connected to bitlines 314 and 316, wordlines 418 and 420 may be configured to be at substantially the same potential as bitlines 314 and 316 to hinder current from flowing from wordline 418 and/or wordline 420 to bitline 314 and/or bitline 316.

Furthermore, it may be desirable to hinder currents from flowing from wordline 308 into memory cells 404 and 414. To do so, bitlines 426 and 430 may be configured to be at substantially the same potential as wordline 308 to hinder current from flowing from wordline 308 to bitline 426 via memory cell 404 and to hinder current from flowing from wordline 308 to bitline 430 via memory cell 414. In addition, bitlines 424 and 428 may be configured at a lower potential than wordline 308 so that current is hindered from flowing from bitline 424 to wordline 308 through memory cell 404 and from bitline 428 to wordline 308 through memory cell 414.

Other memory cells not connected to either wordline 308 or bitlines 314 and 316 (i.e., memory cells 402, 406, 412, and 416) may be configured to hinder consumption of current as is illustrated in FIG. 6. For example, bitlines 424 and 428 may be configured at the same potential as wordlines 418 and 420 to hinder current from flowing through left-hand diodes of memory cells 402, 406, 412, and 416. Furthermore, bitlines 426 and 430 and wordlines 418 and 420 may be configured to reverse bias right-hand diodes of memory cells 402, 406, 412, and 416.

The above discussion has assumed that memory element 302 is configured so that memory element 302 changes to a low-resistance state when a voltage greater than the turn-on voltage of memory element 302 is applied between electrodes 306 and 304 so that electrode 306 is at a higher potential than electrode 304. Similarly, the above discussion has assumed that memory element 302 changes to a high-resistance state when a voltage greater than the turn-off voltage of memory element 302 is applied across electrodes 304 and 306 so that electrode 304 is at a higher potential than electrode 306.

However, memory element 302 may be reversed so that memory element 302 changes to a high-resistance state when a voltage greater than the turn-off voltage of memory element 302 is applied between electrodes 306 and 304 so that electrode 306 is at a higher potential than electrode 304. In this configuration, memory element 302 may change to a low-resistance state when a voltage greater than the turn-on voltage of memory element 302 is applied across electrodes 304 and 306 so that electrode 304 is at a higher potential than electrode 306.

Furthermore, the above discussion has assumed that a high-resistance state of memory element 302 corresponds to a bit value of "0" and that a low-resistance state of memory element 302 corresponds to a bit value of "1." However, as was mentioned above, memory devices may be constructed based on an understanding that the high-resistance state of memory element 302 corresponds to a bit value of "1" and that the low-resistance state of memory element 302 corresponds to a bit value of "0" without changing the principles of writing and reading memory cell 300.

The above discussion has referred to a memory element having a high resistance state and a low resistance state. However, in some embodiments of the invention, a memory element may be configurable in more than two different resistive states. Such a memory element may store more than one bit of information and may be used in a memory cell such as memory cell 300. Each of a plurality of different programming voltages may correspond to a different one of a plurality of different resistive states of the memory element.

The methods of programming memory cell 300 described above may be adapted to program a memory element having more than one resistive state by applying one of the plurality of programming voltages to the memory element in order to configure the memory element in the resistive state corresponding to the applied programming voltage. Furthermore, the methods of reading memory cell 300 described above may be adapted to read the memory element by comparing a current resulting from a voltage applied to the memory element to a plurality of different reference currents to determine in which of the plurality of different resistive states the memory cell is configured.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory cell programming method comprising:
   providing a memory cell comprising a first conductive line, a second conductive line, a third conductive line, and a memory element, the memory element being electrically connected to the third conductive line and selectively electrically connected to the first and second conductive lines;
   using the memory element, storing information via a first resistive state of the memory element;
   electrically disconnecting the first conductive line from the memory element;
   electrically connecting the second conductive line to the memory element; and
   conducting a current from the third conductive line through the memory element to the second conductive line effective to configure the memory element in a second resistive state different from the first resistive state.

2. The method of claim 1 wherein the memory element comprises at least one of an ionic conducting chalcogenide, a binary metal oxide, a perovskite oxide, a colossal magnetoresistive, or a polymer.

3. The method of claim 1 wherein the memory element is configured to store the information in a non-volatile manner in the absence of a voltage or a current.

4. The method of claim 1 wherein the memory element is selectively electrically connected to the first conductive line via a first diode oriented to conduct current from the first conductive line to the memory element when the first diode is forward biased and is selectively electrically connected to the second conductive line via a second diode oriented to conduct current from the memory element to the second conductive line when the second diode is forward biased.

5. The method of claim 1 wherein the first and second conductive lines are bitlines and the third conductive line is a wordline.

6. A memory cell programming method comprising:
   providing a memory cell comprising a first conductive line, a second conductive line, a third conductive line, a first selectively conducting device, a second selectively conducting device and a memory element, a first electrode of the memory element being electrically connected to the third conductive line and a second electrode of the memory element being connected to the first conductive line via the first selectively conducting device and to the second conductive line via the second selectively conducting device;
   using the memory element, storing information via a first resistive state of the memory element; and
   conducting a current from the first conductive line through the first selectively conducting device and the memory element to the third conductive line effective to configure the memory element in a second resistive state different from the first resistive state.

7. The method of claim 6 further comprising during the conducting of the current, applying a voltage across the first conductive line and the third conductive line, the first conductive line being at a higher potential than the third conductive line during the applying of the voltage.

8. The method of claim 6 further comprising during the conducting of the current, applying a voltage across the second conductive line and the third conductive line, the second conductive line being at a higher potential than the third conductive line during the applying of the voltage.

9. The method of claim 6 wherein the memory element is highly conductive of current when the memory element is in the first resistive state and the memory element is highly resistive of current when the memory element is in the second resistive state.

10. The method of claim 6 wherein the memory element is highly resistive of current when the memory element is in the first resistive state and the memory element is highly conductive of current when the memory element is in the second resistive state.

11. The method of claim 6 wherein the first selectively conducting device comprises a first diode and the second selectively conducting device comprises a second diode.

12. A memory cell reading method comprising:
providing a memory cell comprising a first conductive line, a second conductive line, a third conductive line, and a memory element electrically connected to the third conductive line and selectively electrically connected to the first and second conductive lines, the memory element being disposed to be selectively configured in any of a plurality of different resistive states;
electrically disconnecting the first conductive line from the memory element;
electrically connecting the second conductive line to the memory element; and
conducting an electrical current from the third conductive line through the memory element to the second conductive line; and
based on the current, determining that the memory element is configured in a particular one of the plurality of different resistive states.

13. The method of claim 12 wherein the memory element is configured to remain in the particular one of the plurality of different resistive states in the absence of a voltage across the memory element or a current running through the memory element.

14. The method of claim 12 wherein the memory element is selectively electrically connected to the first conductive line via a first diode oriented to conduct current from the first conductive line to the memory element when the first diode is forward biased and is selectively electrically connected to the second conductive line via a second diode oriented to conduct current from the memory element to the second conductive line when the second diode is forward biased.

15. The method of claim 12 wherein the first and second conductive lines are bitlines and the third conductive line is a wordline.

16. The method of claim 12 wherein the connecting of the second conductive line to the memory element comprises applying a voltage across the third conductive line and the second conductive line, the third conductive line being at a higher potential than the second conductive line during the applying of the voltage.

17. A memory cell reading method comprising:
providing a memory cell comprising a first conductive line, a second conductive line, a third conductive line, a first selectively conducting device, a second selectively conducting device, and a memory element, a first electrode of the memory element being electrically connected to the third conductive line and a second electrode of the memory element being connected to the first conductive line via the first selectively conducting device and to the second conductive line via the second selectively conducting device, the memory element being disposed to be selectively configured in any of a plurality of different resistive states;
conducting an electrical current from the first conductive line through the first selectively conducting device and the memory element to the third conductive line; and
based on the current, determining that the memory element is configured in a particular one of the plurality of different resistive states.

18. The method of claim 17 further comprising applying a voltage across the first conductive line and the third conductive line, the first conductive line being at a higher potential than the third conductive line during the applying of the voltage.

19. The method of claim 17 wherein the particular one of the plurality of different resistive states is associated with a value of a bit of information.

20. The method of claim 17 wherein the determining comprises comparing the current to a reference current.

21. The method of claim 17 wherein the determining comprises determining that the current is very small or immeasurable and that the memory element is in a high resistance state.

22. The method of claim 17 wherein the first selectively conducting device comprises a first diode and the second selectively conducting device comprises a second diode.

23. A memory device comprising:
a first conductive line;
a second conductive line;
a memory element disposed to be selectively and reversibly configured in one of two different resistive states;
a first selectively conducting device connecting the first conductive line to a first electrode of the memory element;
a second selectively conducting device connecting the second conductive device to the first electrode of the memory element; and
a third conductive line connected to a second electrode of the memory element.

24. The device of claim 23 wherein the first and second conductive lines are bitlines and the third conductive line is a wordline.

25. The device of claim 23 wherein the first selectively conducting device comprises a first diode and the second selectively conducting device comprises a second diode.

26. The device of claim 25 wherein the first diode is configured to conduct current from the first conductive line to the first electrode when the first diode is forward biased and the second diode is configured to conduct current from the first electrode to the second conductive line when the second diode is forward biased.

27. The device of claim 25 wherein:
the second electrode of the memory element is directly connected to the third conductive line;
the first electrode of the memory element is directly connected to a first electrode of the first diode;
a second electrode of the first diode is directly connected to the first conductive line;
the first electrode of the memory element is directly connected to a first electrode of the second diode; and
a second electrode of the second diode is directly connected to the second conductive line.

28. The device of claim 27 wherein the first electrode of the first diode is a cathode of the first diode and the first electrode of the second diode is an anode of the second diode.

29. The device of claim 23 wherein the memory device is configured to:
convey the resistive state of the memory element via a first current flowing from the third conductive line through the memory element to the second conductive line; and
hinder a second current from flowing from the third conductive line through the memory element to the first conductive line while the resistive state of the first memory element is being conveyed by the first current.

* * * * *

UNITED STATES PATENT AND TRADEMARK OFFICE
CERTIFICATE OF CORRECTION

| | | |
|---|---|---|
| PATENT NO. | : 8,154,906 B2 | Page 1 of 1 |
| APPLICATION NO. | : 12/833810 | |
| DATED | : April 10, 2012 | |
| INVENTOR(S) | : Jun Liu | |

It is certified that error appears in the above-identified patent and that said Letters Patent is hereby corrected as shown below:

On the Title page, in field (56), under "U.S. Patent Documents", in column 2, line 4, delete "Chevallier" and insert -- Rinerson --, therefor.

Signed and Sealed this
Twenty-sixth Day of June, 2012

David J. Kappos
*Director of the United States Patent and Trademark Office*